US006097240A

United States Patent [19]

Lapushin

[11] Patent Number: 6,097,240

[45] Date of Patent: Aug. 1, 2000

[54] TEMPERATURE CONTROLLED ATTENUATOR AND METHOD FOR STABILIZING A TEMPERATURE-DEPENDENT VOLTAGE

[75] Inventor: Semyon Lapushin, Tucker, Ga.

[73] Assignee: Antec Corporation, Duluth, Ga.

[21] Appl. No.: 09/200,271

[22] Filed: Nov. 25, 1998

Related U.S. Application Data

[60] Provisional application No. 60/072,048, Jan. 21, 1998.

[51] Int. Cl.[7] .............................. H01L 35/00; H03K 3/42

[52] U.S. Cl. .............................. 327/513

[58] Field of Search .............................. 327/512, 513; 324/703; 331/176

[56] References Cited

U.S. PATENT DOCUMENTS

| | | | |
|---|---|---|---|
| 4,096,382 | 6/1978 | Numata et al. | 250/214 A |
| 4,352,053 | 9/1982 | Oguchi et al. | 323/220 |
| 4,438,348 | 3/1984 | Casper et al. | 327/513 |
| 4,741,476 | 5/1988 | Russo et al. | 236/46 R |
| 5,537,049 | 7/1996 | Oita et al. | 327/313 |
| 5,990,720 | 11/1999 | Tokioka et al. | 327/253 |

*Primary Examiner*—My-Trang Nu Ton

[57] ABSTRACT

A circuit and method for compensating for variations in voltages in a circuit or device that are caused by temperature changes imposed on the circuit or device. The circuit is a temperature-controlled attenuator that comprises an input and an output. The input is to be coupled to a point in the circuit or device carrying the temperature-dependent voltage. At least one thermistor is coupled between the input and the output by a resistor network. The resistor network comprises a plurality or resistors whose values are selected based upon selected points on the temperature-voltage curve for the circuit and a desired compensated voltage.

9 Claims, 4 Drawing Sheets

(b)

TEMPERATURE CONTROLLED ATTENUATOR AND METHOD FOR STABILIZING A TEMPERATURE-DEPENDENT VOLTAGE

CROSS-REFERENCE TO RELATED APPLICATION

This application claims priority based on U.S. Provisional application Ser. No. 60/072,048 filed Jan. 21, 1998, entitled "Temperature Controlled Attenuator."

TECHNICAL FIELD

The present invention relates to a circuit and method for compensating for temperature-dependent variations of a voltage in a circuit.

BACKGROUND OF THE INVENTION

There are many circuits and devices that generate voltage signals that vary in magnitude with changes in temperature. This is undesirable and the temperature variations must be compensated for in order to achieve accurate operation of the circuit or device. Likewise, compensation is necessary for proper operation of other circuits that receive the temperature dependent voltage as an input.

Consequently, networks have been developed to compensate for the temperature variations. These prior art temperature compensation networks comprise a voltage-controlled circuit and one or more temperature sensors (network of thermistors) coupled to the circuit or device to sense temperature changes imposed on the circuit or device. The temperature sensors convert changes of temperature into a voltage signal that is coupled to the voltage-controlled circuit in order to adjust a level of a voltage in the circuit or device based on a predetermined mathematical relationship. The prior art temperature compensation networks indirectly compensate for changes in temperature, require several additional circuits, and therefore can be significantly expensive.

It is desirable to provide a circuit and method for directly adjusting for temperature variations of a voltage in a circuit or device.

SUMMARY OF THE INVENTION

The present invention is directed to a circuit and method for compensating for variations in voltages in a circuit or device that are caused by temperature changes imposed on or in the circuit or device. The circuit of the present invention is a temperature-controlled attenuator that comprises an input and an output. The input is to be coupled to a point of the circuit or device carrying the temperature dependent voltage. At least one thermistor is coupled between the input and the output of the circuit of the present invention by a resistor network. The resistor network comprises a plurality of resistors whose values are selected based upon selected points on the temperature-voltage curve for the circuit and a desired compensated voltage.

Furthermore, the present invention is directed to a method for stabilizing a temperature-dependent voltage in a circuit, comprising the steps of coupling at least one thermistor to a point of the circuit carrying the temperature dependent voltage, coupling a resistor network comprising a plurality of resistors between the thermistor and an output, and selecting values for the resistors in the resistor network based upon selected points on a temperature-voltage curve for the circuit and a desired compensated voltage so as to deliver a compensated voltage at the output.

DETAILED DESCRIPTION OF THE INVENTION

Figure 1:
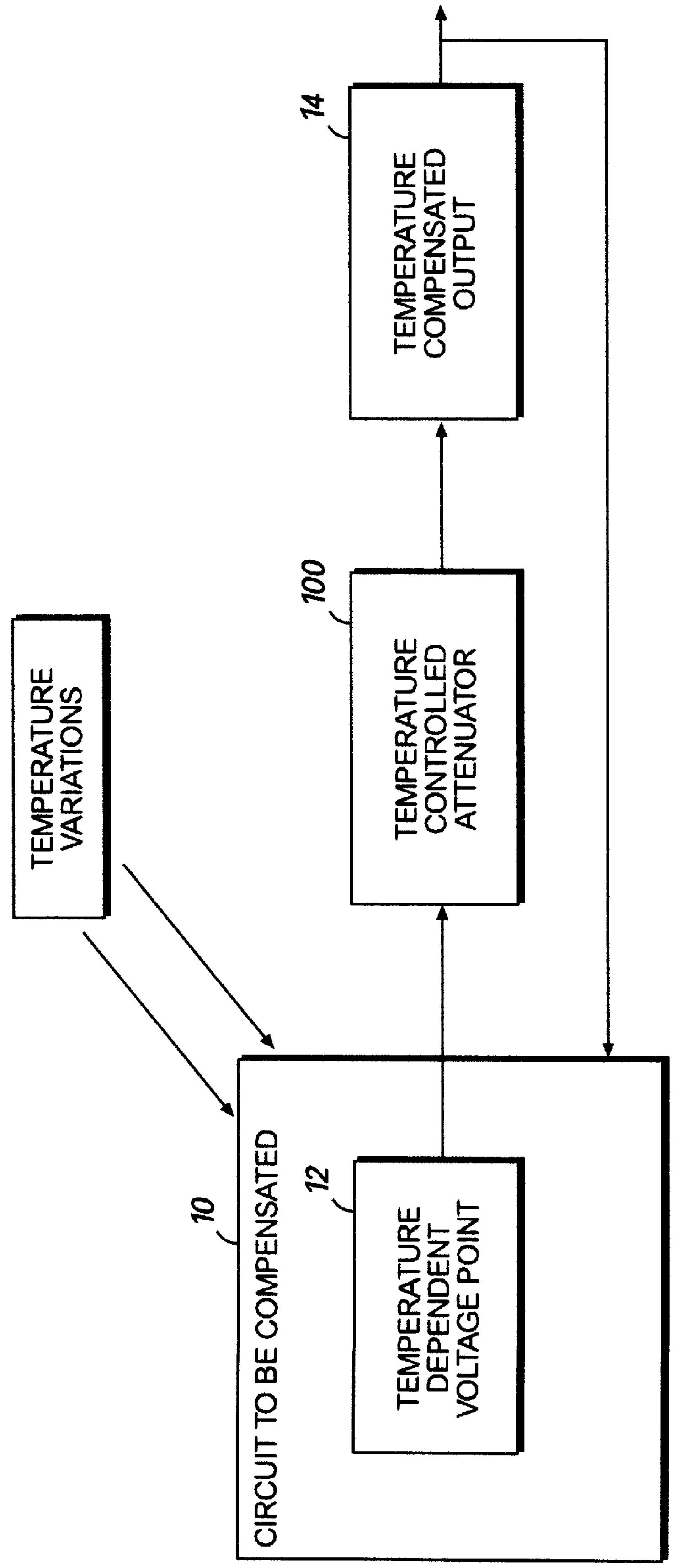
FIG. 1 is a block diagram showing the basic environment in which the temperature controlled attenuator according to the present invention is useful.

The present invention is directed to a circuit and method that compensates for temperature effects on a voltage signal in a circuit or device. The circuit according to the present invention is a temperature controlled attenuator (TCA) and is generally shown in FIG. 1 at reference numeral 100. The TCA 100 connects to a circuit or device to be compensated, shown at reference numeral 10, and in particular, couples to a temperature-dependent voltage point 12 in the circuit or device 10 and generates a temperature-compensated output 14. The temperature compensated output 14 may be coupled back to other components or points in the circuit 10. In essence, the TCA 100 may couple between two components in the circuit 10. Alternatively, the TCA 100 may supply a temperature-compensated output 14 to another circuit or device, depending on a particular application.

The TCA 100, described in more detail hereinafter, is suitable to compensate for a temperature-dependent direct current (DC) voltage or a low frequency alternating current (AC) in a circuit or device 10. The TCA 100 is most useful if the temperature-voltage curve of the circuit or device 10:

(1) is not time dependent;

(2) is reproducible under repeatable temperature cycling;

(3) is monotonic within a required after compensation accuracy (in other words, the temperature-voltage curve does not have local fluctuations that exceed the maximum allowable after-compensation fluctuation); and (4) has a positive slope, negative slope, or is "C" shaped.

Figure 2:
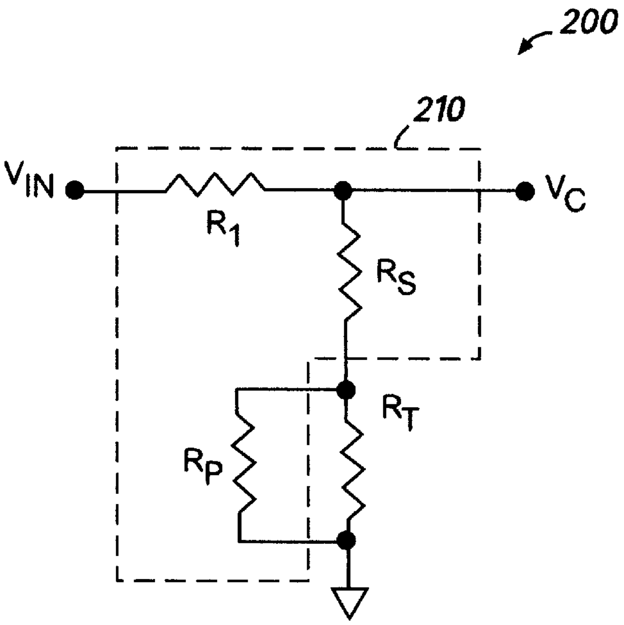
FIG. 2 is a schematic diagram of a temperature controlled attenuator according to a first embodiment of the present invention.
Figure 3:
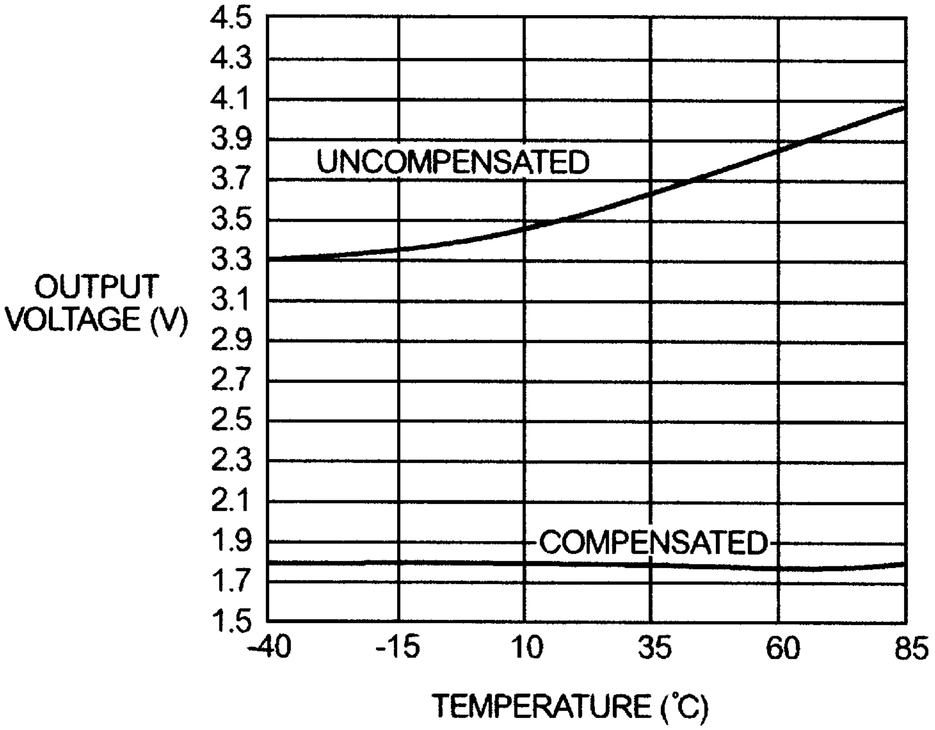
FIG. 3 is a graphical diagram showing the temperature variations before and after compensation using the temperature controlled attenuator of FIG. 1.

With reference to FIG. 2, a TCA 200 according to a first embodiment of the present invention is shown that is useful for a circuit or device known to have a temperature-voltage curve with a positive slope. The temperature-voltage curve with a positive slope for a particular type of circuit is shown at the top of the graph in FIG. 3. Voltage level increases as a function of temperature. The specific curve shown in FIG. 3 is based on data taken from temperature tests on a radio frequency (RF) detector circuit, as an example.

The TCA 200 comprises an input $V_{IN}$, an output $V_C$, a thermistor $R_T$, and a resistor network 210 comprising a plurality of resistors. The input $V_{IN}$ is coupled to a point of the circuit or device 10 that carries the temperature-dependent voltage signal. The resistor network 210 connects the thermistor between the input $V_{IN}$ and the output $V_C$. In particular, the resistor network 210 comprises a first resistor $R_1$ coupled between the input $V_{IN}$ and the output $V_C$, a second resistor $R_S$ connected at one end to a node between the first resistor $R_1$ and the output $V_C$ and is connected in series with the thermistor, which is then connected to ground, and a third resistor $R_P$ connected in parallel with the thermistor $R_T$.

The thermistor $R_T$ is, for example, an NTC thermistor having a 1 kΩ+/−5% value at room temperature ($R_{TO}$=1 kΩ). An NTHS-J14 thermistor, for example, has the temperature characteristics listed below.

| Temperature (° C.) | Resistance (kΩ) |
|---|---|
| −40 | 14.4 |
| −15 | 4.685 |
| 10 | 1.68 |
| 25 | 1 |
| 35 | 0.741 |
| 60 | 0.35 |
| 85 | 0.1855 |

The goal of the TCA 200 is to make the voltage at the output $V_C$, the compensated voltage, close to the voltage for the circuit at some room or normal operating temperature, such as 25° C. The TCA 200 outputs a voltage that is relatively stable despite changes in the input voltage with temperature.

Three points on the temperature-voltage curve of the circuit or device 10 are selected for compensation: $V_O$ (voltage at room temperature), $V_N$ (voltage at the "most negative" or lowest temperature), and $V_P$ (voltage at the "most positive" or highest temperature). Three equations can be written each representing the voltage divider solutions of the TCA 200 at the corresponding temperature points on the temperature-voltage curve. The equations are:

$$V_C = V_O * [((R_{TO} * R_P)/(R_{TO} + R_P)) + R_S]/[((R_{TO} * R_P)/(R_{TO} + R_P)) + R_S + R_1]; \quad (1)$$

$$V_C = V_N * [((R_{TN} * R_P)/(R_{TN} + R_P)) + R_S]/[((R_{TN} * R_P)/(R_{TN} + R_P)) + R_S + R_1]; \quad (2)$$

$$V_C = V_P * [((R_{TP} * R_P)/(R_{TP} + R_P)) + R_S]/[((R_{TP} * R_P)/(R_{TP} + R_P)) + R_S + R_1]; \quad (3)$$

where $R_{TO}$ is the value of the thermistor at room temperature, $R_{TN}$ is the value of the thermistor at the most negative (lowest) temperature, and $R_{TP}$ is the value of the thermistor at the most positive (highest) temperature. $V_O$ is the voltage on the temperature-voltage curve of the circuit or device 10 at room temperature, $V_N$ is the voltage on the temperature-voltage curve at the most negative (lowest) temperature and $V_P$ is the voltage on the temperature-voltage curve at the most positive (highest) temperature. Furthermore, the compensated voltage $V_C$ is set to be substantially equal to or less than the minimum of the voltages on the temperature-voltage curve at the three temperatures of interest (room temperature, lowest temperature and highest temperature). That is, $V_C \leqq \mathrm{MIN}(V_O, V_N, V_P)$.

Equations (1)–(3) constitute three equations with three unknowns $R_1$, $R_S$, and $R_P$. The values of the resistors $R_1$, $R_S$, and $R_P$ can be solved from these three equations. In the example shown in FIG. 3, the temperatures corresponding to the room temperature, lowest temperature, and highest temperature are +25° C., −40° C., and +85° C., respectively. The value of $V_C$ is set to 1.8 V, which is about half of $V_O$, in this example. Consequently, in this example, the value of the resistors $R_1$, $R_S$, and $R_P$ are 933 Ω, 619 Ω, and 536 Ω, respectively. In general, if the values of the resistors $R_1$, $R_S$, and $R_P$ determined from equations (1)–(3) are negative, then the value set for $V_C$ must be decreased and the equations re-computed. The curve shown at the bottom of FIG. 3 is the temperature-voltage curve for the circuit or device 10 after the TCA 200 with the computed values for $R_1$, $R_S$, and $R_P$ is coupled to the temperature-dependent voltage point of the circuit or device. The TCA 200 achieves an improvement in voltage stability of a maximum relative deviation from average from 21% to 1.04%.

Figure 4:
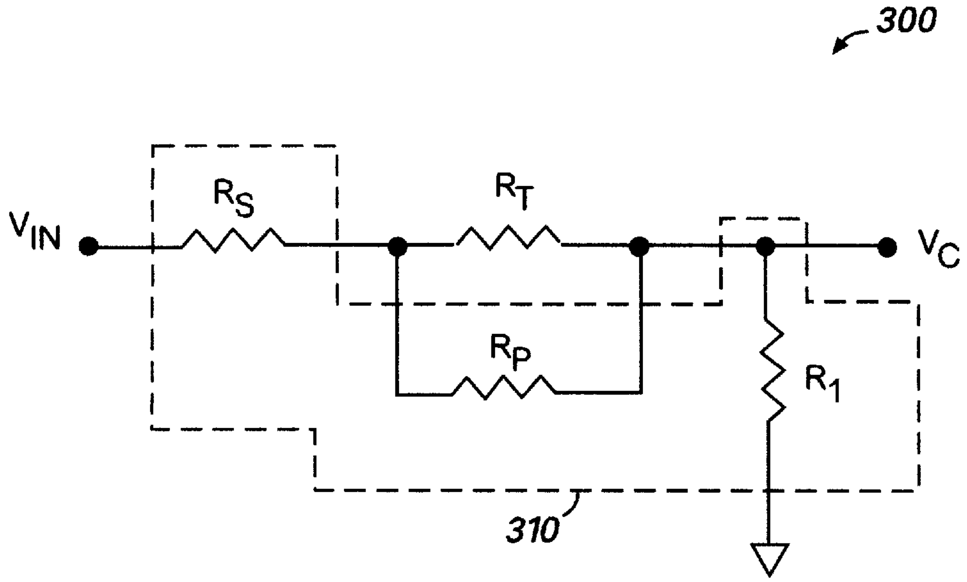
FIG. 4 is a schematic diagram of a temperature controlled attenuator according to a second embodiment of the present invention.

FIG. 4 shows a TCA 300 according to a second embodiment of the present invention. TCA 300 is suitable for compensating for a circuit or device having a temperature-voltage curve with a negative slope. The TCA 300 comprises a thermistor $R_T$ and a resistor network 310. The resistor network 310 comprises resistors $R_1$, $R_S$, and $R_P$, arranged in a different configuration than in TCA 200 shown in FIG. 2.

Specifically, resistor $R_S$ is connected in series with the input $V_{IN}$ and with the thermistor $R_T$. The resistor $R_P$ is connected in parallel with the thermistor $R_T$. The thermistor $R_T$ is connected at one end to the resistor $R_S$ and at another end to the output $V_C$. The resistor $R_1$ is connected at one end to a node between the thermistor $R_T$ and the output $V_C$, and is connected to ground at the other end.

Figure 5:
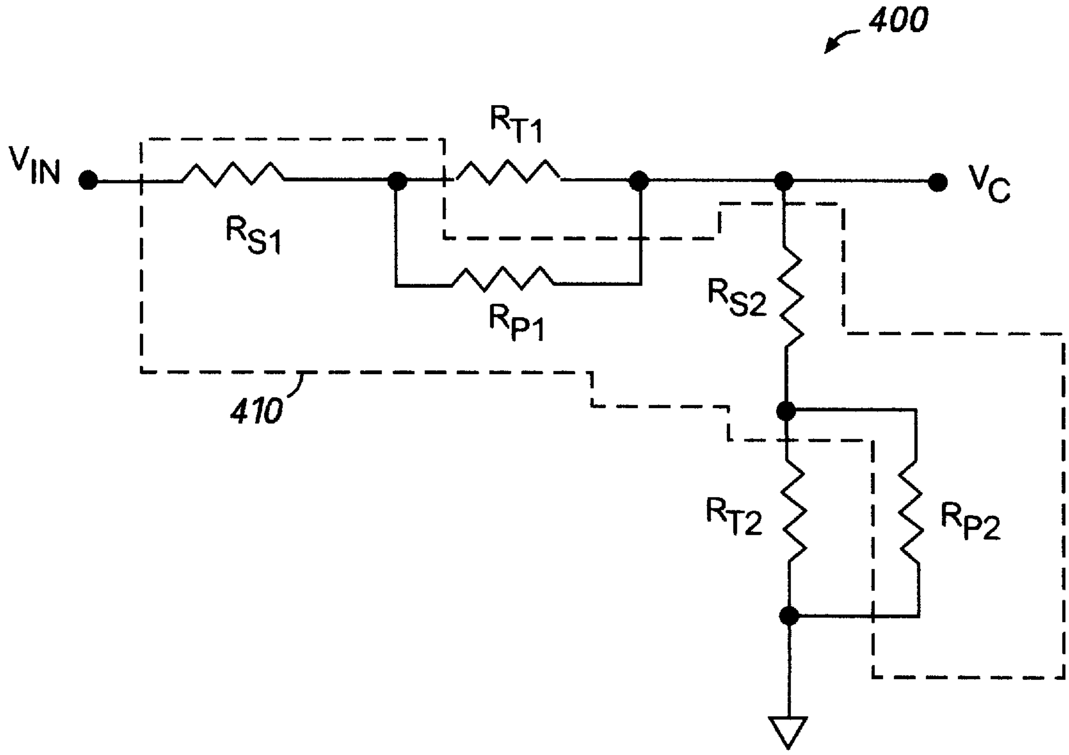
FIG. 5 is a schematic diagram of a temperature controlled attenuator according to a third embodiment of the present invention.
Figure 6:
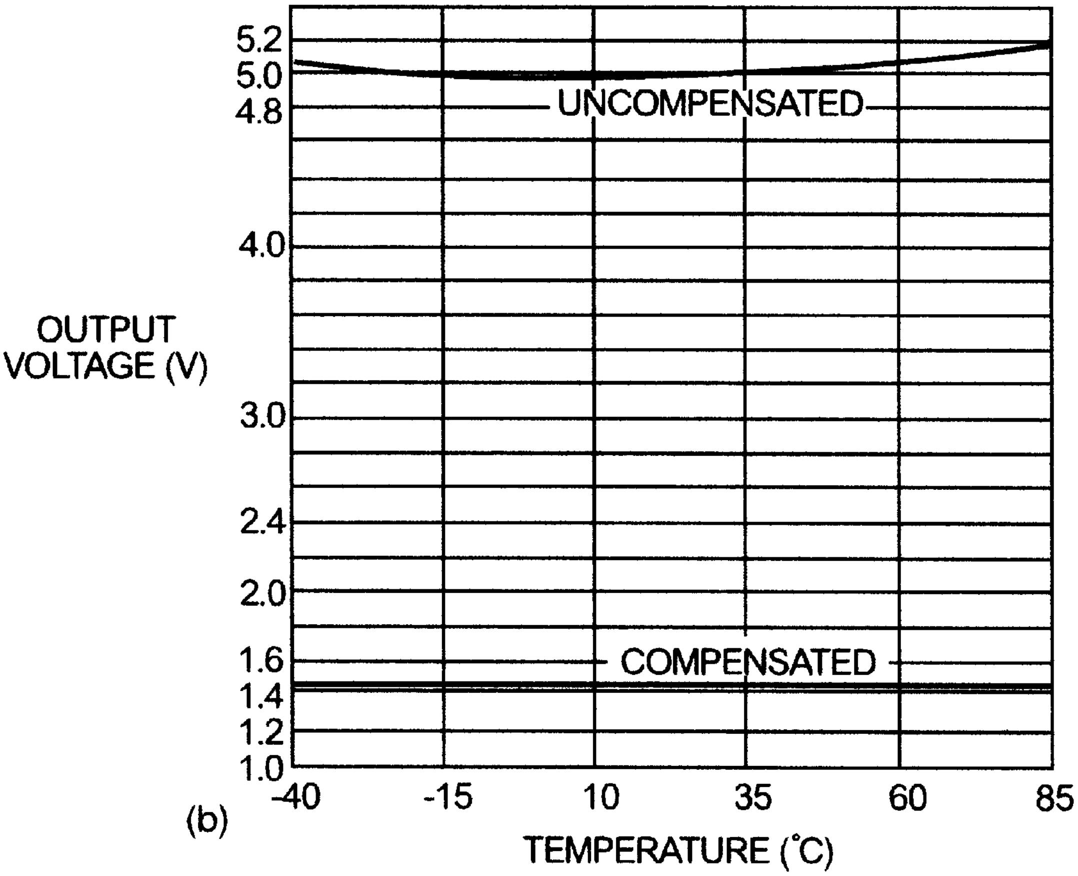
FIG. 6 is a graphical diagram showing the temperature variations before and after compensation using the temperature controlled attenuator of FIG. 5.

FIG. 5 illustrates a TCA 400 according to a third embodiment of the present invention. The TCA 400 is designed to compensate for temperature variations for a temperature-dependent voltage whose temperature-voltage curve is "C" shaped, as shown in the top of FIG. 6.

TCA 400 is more complex than TCA 200 and TCA 300. In particular, the TCA 400 comprises two thermistors, $R_{T1}$ and $R_{T2}$, and the resistor network 410 comprises resistors $R_{S1}$, $R_{S2}$, $R_{P1}$, and $R_{P2}$. Resistor $R_{S1}$ is connected in series between the input $V_{IN}$ and the first thermistor $R_{T1}$. The other end of the first thermistor $R_{T1}$ is connected to the output $V_C$. Resistor $R_{P1}$ is connected in parallel with the first thermistor $R_{T1}$. Resistor $R_{S2}$ is connected at one end to a node between the first thermistor $R_{T1}$ and output $V_C$ and is connected at the other end to the second thermistor $R_{T2}$. The other end of the second thermistor $R_{T2}$ is connected to ground. Resistor $R_{P2}$ is connected in parallel with the second thermistor $R_{T2}$.

TCA 400 has four variables, $R_{S1}$, $R_{S2}$, $R_{P1}$, and $R_{P2}$. Consequently, four equations describing TCA 400 are needed to determine the values of the four resistors. The four equations, well known to those skilled in the art, are written to solve for the four variables at four temperatures on the temperature-voltage curve: −40° C., +10° C., +35° C., and +85° C. with respective voltages $V_{N1}$, $V_{N2}$, $V_{P1}$ and $V_{P2}$. The pair $V_{N1}$, $V_{N2}$ corresponds to the part of the curve with temperatures below normal, and the pair $V_{P1}$, $V_{P2}$ corresponds to the part with temperatures above normal. The curve at the bottom of FIG. 6 represents the compensated curve, which reduces the deviation from 2.6% to 0.46%.

In summary, the present invention is directed to a circuit for stabilizing variations in voltages with temperature. In addition, the present invention is directed to a method for stabilizing a temperature-dependent voltage in a circuit, comprising the steps of coupling at least one thermistor to a point of the circuit carrying the temperature-dependent voltage, coupling a resistor network comprising a plurality of resistors between the thermistor and an output, and selecting values for the resistors in the resistor network based upon selected points on a temperature-voltage curve for the circuit and a desired compensated voltage so as to deliver a compensated voltage at the output.

More specifically, the step of selecting comprises the step of determining values for the resistors in the resistor network based upon voltage divider solutions at the output at points of a temperature-voltage curve corresponding to the lowest temperature, highest temperature, and room temperature. Furthermore, the step of selecting values of the resistors in the resistor network is based upon the compensated voltage being set substantially equal to a minimum of the voltages on the temperature-voltage curve for the circuit at the lowest temperature, highest temperature, and room temperature points.

The above description is intended by way of example only and is not intended to limit the present invention in any way except as set forth in the following claims.

What is claimed is:

1. A temperature controlled attenuator for stabilizing a temperature-dependent voltage of a circuit and for generating as output a substantially stable voltage, the temperature controlled attenuator comprising:

an input coupled to a point of the circuit carrying the temperature-dependent voltage;

an output at which a substantially stable voltage as compared to temperature is supplied;

at least one thermistor coupled between the input and the output; and a resistor network comprising at least three resistors, the resistor network connecting the thermistor between the input and the output;

wherein the values of the resistors in the resistor network are selected based upon at least three selected points on the temperature-voltage curve for the circuit and a desired substantially stable voltage.

2. The attenuator of claim 1 wherein the values of the resistors in the resistor network are determined based upon voltage divider solutions for the attenuator at selected points on the temperature-voltage curve for the circuit corresponding to the lowest temperature, highest temperature, and room temperature.

3. The attenuator of claim 2 wherein the values of the resistors in the resistor network are selected such that the compensated voltage is substantially equal to a minimum of the voltages on the temperature-voltage curve of the circuit at the lowest temperature, highest temperature, and room temperature points.

4. The attenuator of claim 1 wherein the temperature-voltage curve for the circuit has a positive slope, and wherein the resistor network comprises a first resistor, a second resistor, and a third resistor, the first resistor being coupled between the input and the output, the second resistor connected at one end to a node between the first resistor and the output and at the other end in series with the thermistor, and the third resistor being connected in parallel with the thermistor.

5. The attenuator of claim 1 wherein the temperature-voltage curve for the circuit has a negative slope, and wherein the resistor network comprises a first resistor, a second resistor, and a third resistor, the first resistor being connected in series with the input and the thermistor, the second resistor being connected in parallel with the thermistor, the thermistor being connected between the output and the first resistor, and the third resistor being connected between a node between the thermistor and the output, and ground.

6. The attenuator of claim 1 wherein the temperature-voltage curve for the circuit is substantially “C” shaped, and comprising first and second thermistors, wherein the resistor network comprises first, second, third, and fourth resistors, the first resistor being connected in series between the input and the first thermistor, the first thermistor being connected between the first resistor and the output, the second resistor being connected in parallel with the first thermistor, the third resistor being connected to a node between the first thermistor and the output, the second thermistor being connected in series between the third resistor and ground, and the fourth resistor being connected in parallel with the second thermistor.

7. A method for stabilizing a temperature-dependent voltage in a circuit, comprising steps of:

coupling at least one thermistor to a point of the circuit carrying the temperature-dependent voltage;

coupling a resistor network comprising at least three resistors between the at least one thermistor and an output; and selecting values for the resistors in the resistor network based upon at least three selected points of a temperature-voltage curve for the circuit and a desired substantially stable voltage, so as to deliver a substantially stable voltage as compared to temperature at the output.

8. The method of claim 7 wherein the step of selecting comprises the step of determining values for the resistors in the resistor network based upon voltage divider solutions at the output at points on the temperature-voltage curve for the circuit corresponding to the lowest temperature, highest temperature, and room temperature.

9. The method of claim 8 wherein the step of selecting further comprises the step of setting a desired compensated voltage at the output substantially equal to a minimum of the voltages on the temperature-voltage curve for the circuit at the lowest temperature, highest temperature, and room temperature points.

* * * * *